United States Patent
Koga et al.

(10) Patent No.: US 11,246,250 B2
(45) Date of Patent: Feb. 8, 2022

(54) EQUIPMENT ELEMENT MAINTENANCE MANAGEMENT SYSTEM AND EQUIPMENT ELEMENT MAINTENANCE MANAGEMENT METHOD

(71) Applicant: Panasonic Intellectual Property Management Co., Ltd., Osaka (JP)

(72) Inventors: Hirofumi Koga, Osaka (JP); Yuji Nakajima, Osaka (JP); Kazuyuki Yoshidomi, Osaka (JP); Hitoshi Komatsu, Osaka (JP); Manabu Ohuchi, Osaka (JP); Noritada Kawamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 599 days.

(21) Appl. No.: 15/952,384

(22) Filed: Apr. 13, 2018

(65) Prior Publication Data

US 2018/0368297 A1    Dec. 20, 2018

(30) Foreign Application Priority Data

Jun. 16, 2017   (JP) .............................. JP2017-118303

(51) Int. Cl.
    *H05K 13/00*    (2006.01)
    *H05K 13/08*    (2006.01)
    (Continued)

(52) U.S. Cl.
    CPC ............. *H05K 13/08* (2013.01); *G06Q 10/20* (2013.01); *H05K 13/02* (2013.01); *H05K 13/0408* (2013.01); *H05K 13/0895* (2018.08)

(58) Field of Classification Search
    CPC .... H05K 13/08; H05K 13/083; H05K 13/084; H05K 13/0882; H05K 13/0895; H05K 13/02; H05K 13/0408; G06Q 10/20
    (Continued)

(56) References Cited

U.S. PATENT DOCUMENTS

| 2008/0147232 A1 | 6/2008 | Kuribayashi et al. |
| 2017/0020041 A1 | 1/2017 | Iwase et al. |
| 2017/0099752 A1* | 4/2017 | Kurata ................... H05K 13/04 |

FOREIGN PATENT DOCUMENTS

| CN | 101032199 A | 9/2007 |
| CN | 104206046 A | 12/2014 |

(Continued)

OTHER PUBLICATIONS

English Translation of Chinese Search Report dated Aug. 13, 2020 for the related Chinese Patent Application No. 201810375613.1.

*Primary Examiner* — Peter Dungba Vo
*Assistant Examiner* — Azm A Parvez
(74) *Attorney, Agent, or Firm* — Pearne & Gordon LLP

(57) ABSTRACT

An equipment element maintenance management method for managing a maintenance operation for an equipment element that is attached to manufacturing equipment for manufacturing a product includes: acquiring operation history information of the manufacturing equipment at a predetermined timing; analyzing a tendency of a state of the equipment element based on the acquired operation history information; performing the maintenance operation for the equipment element of which the state is worse than a predetermined state; creating maintenance result information which is a result of the maintenance operation; and creating a repair operation instruction for performing an instruction of a repair operation for the equipment element of which the state after the maintenance operation is not (Continued)

more improved than the predetermined state based on the maintenance result information.

10 Claims, 8 Drawing Sheets

(51) Int. Cl.
  *H05K 13/02* (2006.01)
  *H05K 13/04* (2006.01)
  *G06Q 10/00* (2012.01)
(58) Field of Classification Search
  USPC .................. 29/709, 700, 701, 705, 707, 708
  See application file for complete search history.

(56) References Cited

FOREIGN PATENT DOCUMENTS

| | | | |
|---|---|---|---|
| CN | 104663016 A | 5/2015 | |
| CN | 106105416 A | 11/2016 | |
| EP | 2838332 A1 | 2/2015 | |
| JP | 2004-140162 A | 5/2004 | |
| JP | 2009-038406 A | 2/2009 | |
| WO | 2013/153598 A1 | 10/2013 | |
| WO | 2014/049766 A1 | 4/2014 | |
| WO | 2015/132950 A1 | 9/2015 | |
| WO | WO-2016113864 A1 * | 7/2016 | ............... B08B 5/04 |

\* cited by examiner

FIG. 5A

| MAINTENANCE RESULT INFORMATION (TAPE FEEDER) | | | | | |
|---|---|---|---|---|---|
| FEEDER NUMBER | MAINTENANCE OPERATION DATE | OPERATION CONTENT: RESULT | TORQUE RATING RATIO | FEED ACCURACY (μm) | |
| | | | | Y DIRECTION | X DIRECTION |
| FA01 | 2017/04/03 | CLEANING: GOOD GEAR ADJUSTMENT: GOOD | 1.08 | ±10 | ±12 |
| FA02 | 2017/04/03 | CLEANING: GOOD GEAR ADJUSTMENT: FAIL | 0.78 | ±22 | ±16 |
| FB01 | 2017/04/03 | CLEANING: GOOD GEAR ADJUSTMENT: FAIL | 0.98 | ±14 | ±55 |
| FC01 | 2017/04/04 | CLEANING: GOOD GEAR ADJUSTMENT: GOOD | 1.02 | ±15 | ±14 |
| ... | ... | ... | ... | ... | ... |

FIG. 5B

| REPAIR OPERATION INSTRUCTION (TAPE FEEDER) | | | | |
|---|---|---|---|---|
| FEEDER NUMBER | OPERATION SCHEDULE ITEM | TORQUE RATING RATIO | FEED ACCURACY (μm) | |
| | | | Y DIRECTION | X DIRECTION |
| FA02 | GEAR ADJUSTMENT | 0.78 | ±22 | ±16 |
| FB01 | GEAR ADJUSTMENT | 0.98 | ±14 | ±55 |
| ... | ... | ... | ... | ... |

FIG. 5C

| REPAIR RESULT INFORMATION (TAPE FEEDER) | | | | | |
|---|---|---|---|---|---|
| FEEDER NUMBER | REPAIR OPERATION DATE | OPERATION CONTENT | TORQUE RATING RATIO | FEED ACCURACY (μm) | |
| | | | | Y DIRECTION | X DIRECTION |
| FA02 | 2017/04/07 | MOTOR REPLACEMENT | 1.00 | ±10 | ±14 |
| FB01 | 2017/04/06 | GEAR REPLACEMENT | 0.98 | ±10 | ±10 |
| ... | ... | ... | ... | ... | ... |

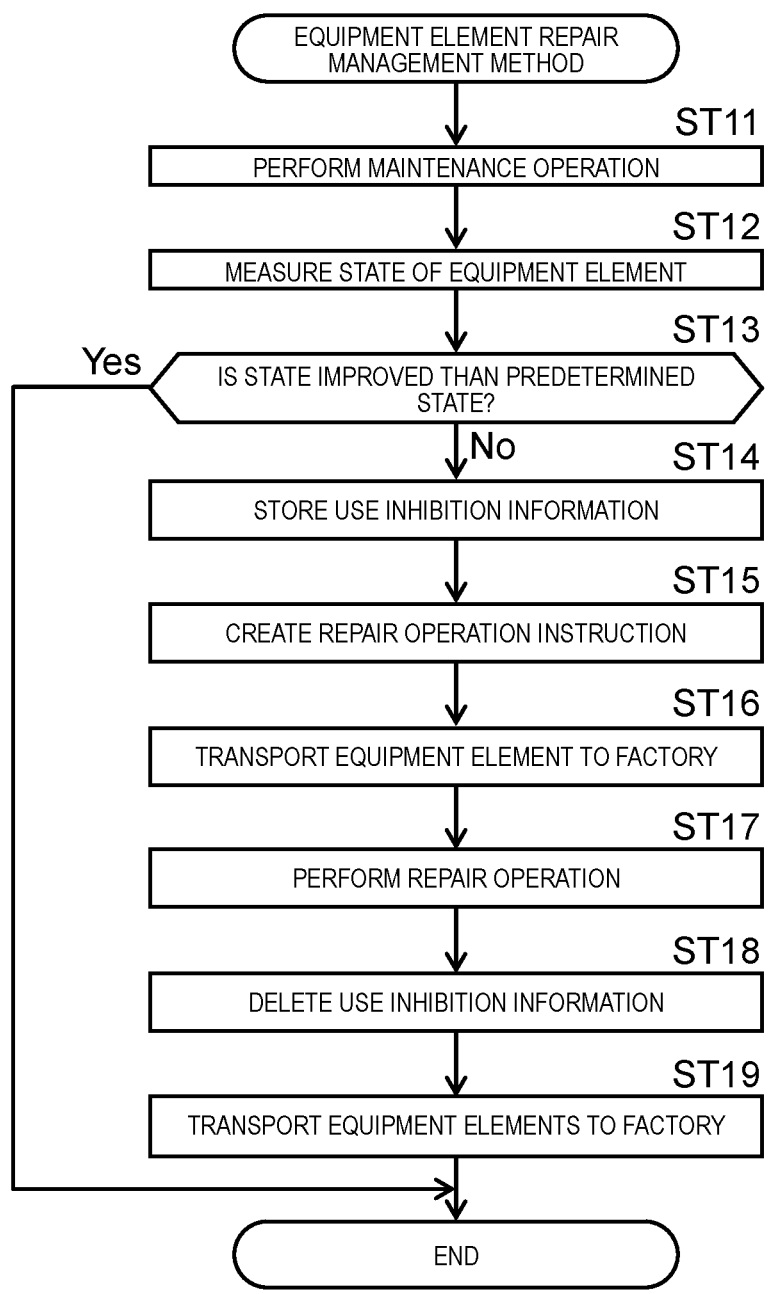

EQUIPMENT ELEMENT MAINTENANCE MANAGEMENT SYSTEM AND EQUIPMENT ELEMENT MAINTENANCE MANAGEMENT METHOD

BACKGROUND

1. Technical Field

The present disclosure relates to an equipment element maintenance management system and an equipment element maintenance management method for managing maintenance operations for an equipment element that is attached to manufacturing equipment for manufacturing a product.

2. Description of the Related Art

A manufacturing equipment, such as a component mounter for manufacturing a product, is used in a state where replaceable equipment elements are selected and attached to according to the product. A component mounter for manufacturing a mounting board for installing an electronic circuit component on a circuit board as a product is used with a component supplier attached thereto for supplying electronic circuit components as an equipment element. In the equipment element, the wear or the distortion of the built-in configuration components increase with increasing time of use, and problems such as an operation error may occur. Therefore, service operations including a maintenance operation such as cleaning and reference position adjustment for the equipment element, and a repair operation such as replacement of components are carried out at a predetermined service timing (for example, Japanese Patent Unexamined Publication No. 2004-140162).

In the service method described in Japanese Patent Unexamined Publication No. 2004-140162, the operation state of each component mounter is monitored in real time at a service center located away from a factory where the component mounter is installed. When the number of times of component supply or the number of times of a supply error occurrence of the component supplier attached to the component mounter is equal to or greater than the set number of times, the component supplier is inhibited from using and transported to the service center to be repaired and inspected. As a result, centralized management of the monitoring information and the service in the service center is realized.

SUMMARY

According to the present disclosure, there is provided an equipment element maintenance management system including: a history information acquirer that acquires operation history information of manufacturing equipment for manufacturing a product at a predetermined timing, the manufacturing equipment being attached with an equipment element; an analyzer that analyzes a tendency of a state of the equipment element based on the acquired operation history information; a maintenance result creator that creates maintenance result information which is a result of a maintenance operation for the equipment element of which the state is analyzed to be worse than a predetermined state; and a repair instruction creator that creates a repair operation instruction for performing an instruction of a repair operation for the equipment element of which the state after the maintenance operation is not more improved than the predetermined state, based on the maintenance result information.

According to the present disclosure, there is provided an equipment element maintenance management method for managing a maintenance operation for an equipment element that is attached to manufacturing equipment for manufacturing a product, the method including: acquiring operation history information of the manufacturing equipment at a predetermined timing; analyzing a tendency of a state of the equipment element based on the acquired operation history information; performing the maintenance operation for the equipment element of which the state is worse than a predetermined state; creating maintenance result information which is a result of the maintenance operation; and creating a repair operation instruction for performing an instruction of a repair operation for the equipment element of which the state after the maintenance operation is not more improved than the predetermined state based on the maintenance result information.

According to the present disclosure, the maintenance operation for the equipment element can be managed efficiently.

BRIEF DESCRIPTION OF THE DRAWINGS

FIG. 5A is an explanatory diagram illustrating an example of maintenance result information used in the equipment element management system of the exemplary embodiment of the present disclosure;

FIG. 5B is an explanatory diagram illustrating an example of a repair operation instruction used in an equipment element management system according to the exemplary embodiment of the present disclosure;

FIG. 5C is an explanatory diagram illustrating an example of repair result information used in the equipment element management system according to the exemplary embodiment of the present disclosure;

FIG. 8 is a flowchart illustrating an equipment element repair management method by the equipment element management system according to the exemplary embodiment of the present disclosure.

DETAILED DESCRIPTION

Prior to the description of the exemplary embodiment, problems in the related art will be briefly described.

In the Japanese Patent Unexamined Publication No. 2004-140162, there was no description on how the repair and inspection of the component supplier inhibited from using was systematically controlled, and there was room for further improvement.

An object of the present disclosure is to provide an equipment element maintenance management system and an equipment element maintenance management method that can manage maintenance operation for an equipment element efficiently.

Figure 2:
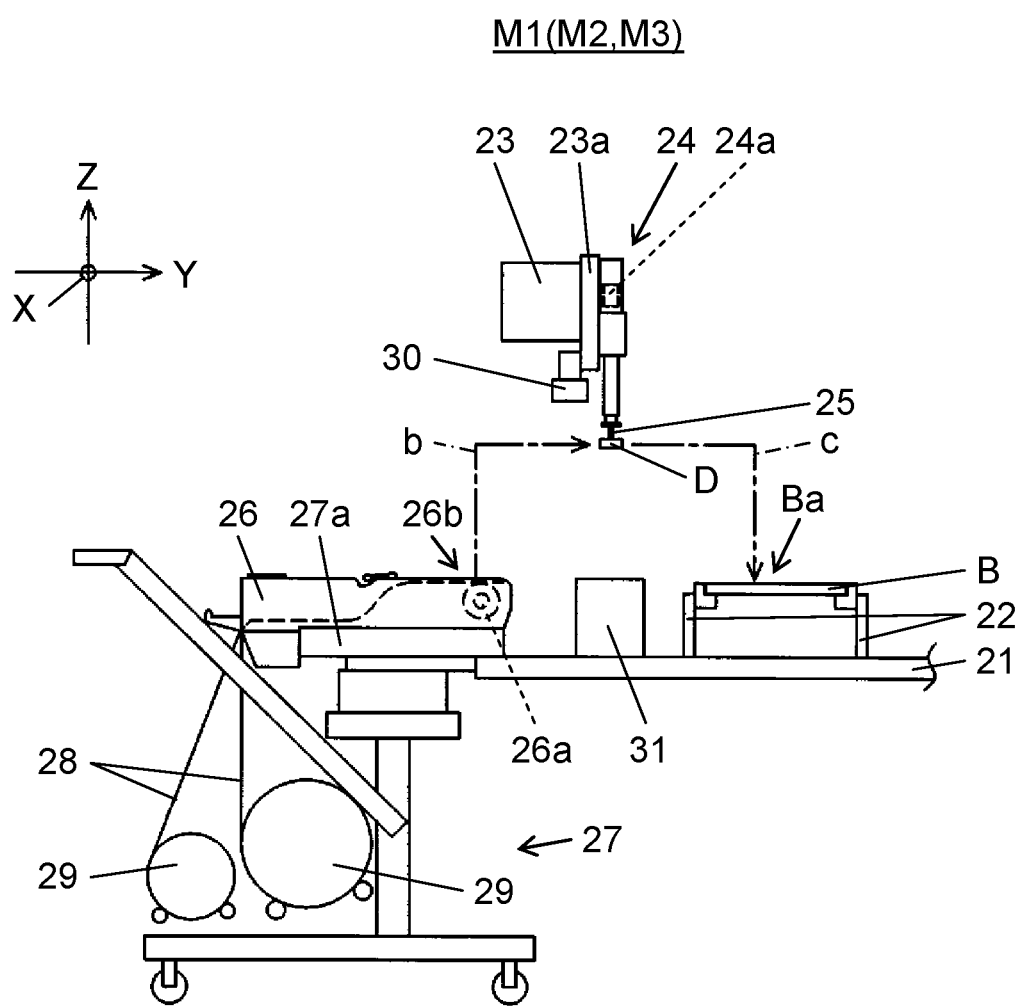
FIG. 2 is an explanatory diagram illustrating a configuration of a component mounter according to the exemplary embodiment of the present disclosure.

The present disclosure will be described below in detail with reference to the drawings. The configurations and the like described below are illustrative examples, and can be appropriately changed according to specifications such as an equipment element management system, a component mounting line, a component mounter, a component supplier, and the like. In the following, the corresponding elements are denoted by the same reference numerals in all the drawings, and redundant explanations are omitted. In FIG. 2 and a part to be described later, as two axial directions orthogonal to each other in a horizontal plane, X direction (the direction perpendicular to paper surface in FIG. 2) in the board transport direction and Y direction (the horizontal direction in FIG. 2) orthogonal to the board transport direction are illustrated. Further, Z direction (vertical direction in FIG. 2) is illustrated as a height direction orthogonal to the horizontal plane.

First, the configuration of equipment element management system 1 will be described with reference to FIG. 1. Equipment element management system 1 is configured with factory F, support center S established at a location away from factory F, and truck T which is transport means for transporting (arrow a) an equipment element such as a tape feeder between factory F and support center S. In factory F, component mounting line L1, which is configured with a plurality of component mounters M1 to M3 connected to each other, is installed. Component mounting line L1 has a function of manufacturing a mounting board while sequentially installing electronic circuit components (hereinafter referred to as "component D", see FIG. 2) on circuit board B (see FIG. 2) by component mounters M to M3.

Each of component mounters M1 to M3 is connected to line management PC 3 via local communication network 2 such as a local area network (LAN). In factory F, maintenance unit 4 for performing a maintenance operation for the equipment element is installed. Maintenance unit 4 is provided with mail receiver 5, maintenance operator 6 for performing the maintenance operation, and maintenance management PC 7 for managing the maintenance operation. Maintenance unit 4 may be installed on the same floor as component mounting line L1, and may be installed in the different building. Also, a plurality of component mounting lines may be installed in factory F. The number of component mounters M1 to M3 constituting component mounting line L1 is not limited to 3, and may be 1 or 2, and 4 or more.

Figure 1:
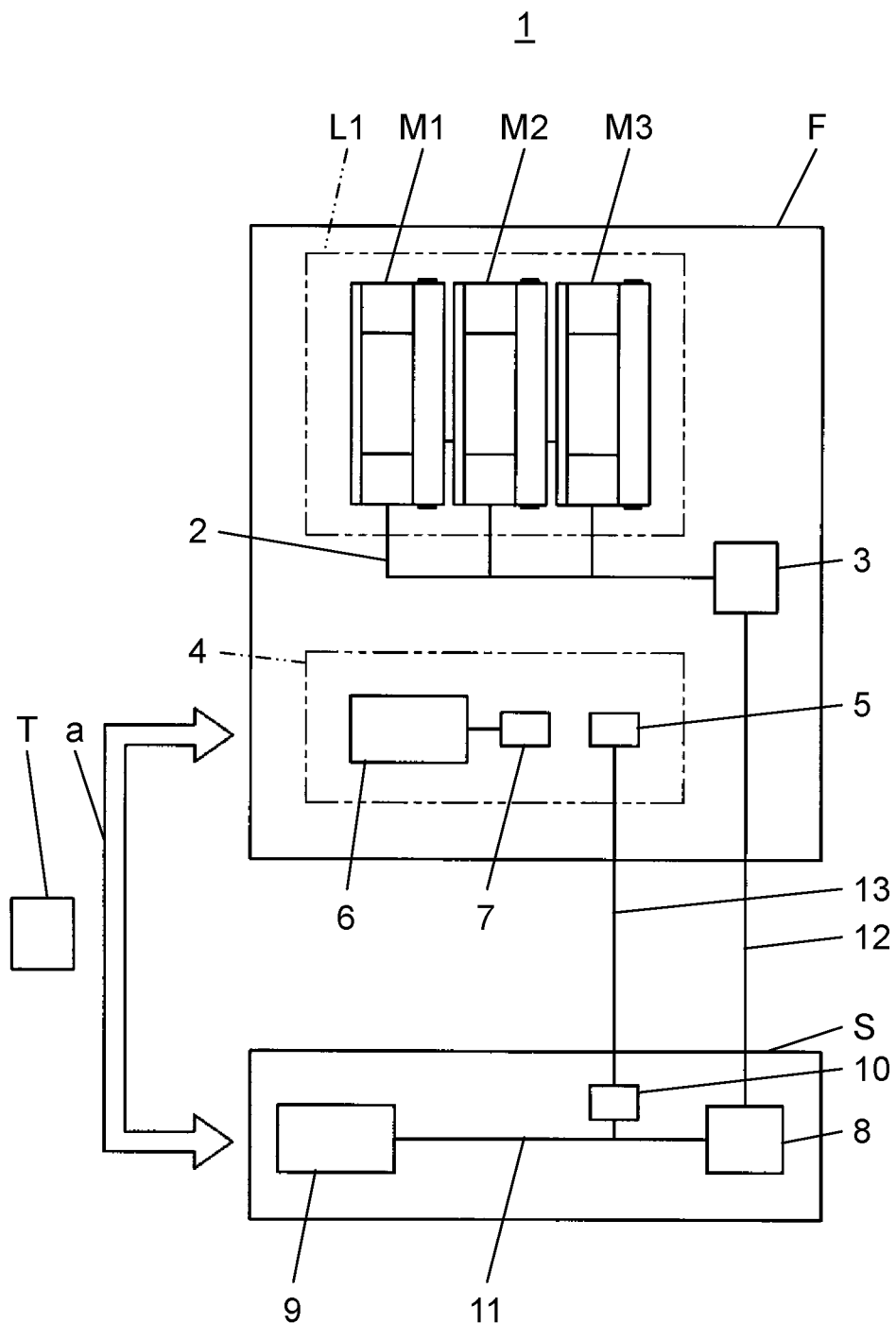
FIG. 1 is an explanatory diagram illustrating a configuration of an equipment element management system according to an exemplary embodiment of the present disclosure.

In FIG. 1, support center S is provided with support management PC 8, repairer 9 for performing a repair operation for the equipment element, and mail server 10. Repairer 9 and mail server 10 are connected to support management PC 8 via local communication network 11. Line management PC 3 and support management PC 8 exchange information via external communication network 12 such as the Internet or a mobile communication line. Mail receiver 5 and mail server 10 exchange information via external communication network 13.

Support center S is opened at a position where the repair operations for the equipment elements of a plurality of factories F (customers) can be efficiently performed. In support center S, in addition to the repair operation of a carried-in equipment element, various kinds of support such as analyzing state tendency of the equipment elements in factory F (customer) which will be described later and extracting the equipment elements requiring maintenance operation to report the results to the person in charge of each factory F are performed.

Next, the configuration of component mounters M1 to M3 will be described with reference to FIG. 2. Component mounters M1 to M3 have a similar configuration, and component mounter M1 will be described below. Component mounter M1 has a function of installing component D on circuit board B. Board transport mechanism 22 provided on the upper surface of base 21 transports circuit board B in the X direction to position and hold circuit board B. Head moving mechanism 23 moves mounting head 24 installed via plate 23a in the X direction and the Y direction. Suction nozzle 25 is installed to a lower end of mounting head 24.

A plurality of tape feeders 26 are mounted side by side in the X direction on feeder base 27a provided on an upper portion of carriage 27 connected to base 21 on the side of board transport mechanism 22. In carriage 27, carrier tape 28 for storing component D to be supplied to component mounter M1 is wound around and held by reel 29. Carrier tape 28 inserted into tape feeder 26 is pitch fed at a regular interval by tape feed mechanism 26a incorporated in tape feeder 26. As a result, component D stored in carrier tape 28 is sequentially supplied to component supply port 26b provided on an upper portion of tape feeder 26.

In a component mounting action, mounting head 24 moves above tape feeder 26 by head moving mechanism 23, and picks up component D supplied to component supply port 26b of tape feeder 26 by vacuum suction with suction nozzle 25 (arrow b). Mounting head 24 holding component D moves above circuit board B held with board transport mechanism 22 by head moving mechanism 23, and mounts component D at predetermined component install position Ba on circuit board B (arrow c).

In FIG. 2, board recognition camera 30 with an optical axis direction facing downward is attached to plate 23a. Board recognition camera 30 is moved in the X direction and Y direction integrally with mounting head 24 by head moving mechanism 23. Board recognition camera 30 is moved above tape feeder 26 to image component D supplied to component supply port 26b. The imaging result is subjected to image recognition, and a supply position deviation amount of supplied component D shifted from the expected normal supply position is calculated. In addition, a supply component recognition error in which component D cannot be recognized because component D is not supplied to component supply port 26b is also detected.

In a case where the supply position deviation amount of component D is large, there is a possibility that a suction mistake in which suction nozzle 25 cannot suck component D occurs. Then, tape feeder 26 adjusts a reference position when tape feed mechanism 26a pitch feeds carrier tape 28 based on the calculated supply position deviation amount. Alternatively, based on the calculated supply position deviation amount, a suction position (the stop position of mounting head 24) when suction nozzle 25 picks up component D is corrected.

In FIG. 2, mounting head 24 is provided with flow rate sensor 24a for measuring the flow rate of the air flowing from suction nozzle 25. When suction nozzle 25 sucks component D normally, the air flowing from suction nozzle 25 becomes smaller, and the vacuum pressure of suction nozzle 25 becomes lower. On the other hand, in a case where the suction mistake such as suction nozzle 25 being unable to hold component D, or component D being sucked by an abnormal posture occurs, the air flowing from suction nozzle 25 increases and the vacuum pressure of suction nozzle 25 increases (vacuum error). Therefore, the presence or absence of the occurrence of the suction mistake (vacuum error) can be detected from the measurement result of the flow rate of the air by flow rate sensor 24a. Instead of flow rate sensor 24a, a vacuum gauge may be provided to determine whether the suction mistake (vacuum error) occurs from the measurement result of the vacuum pressure by the vacuum gauge.

On an upper surface of base 21 between board transport mechanism 22 and tape feeder 26, component recognition camera 31 with the optical axis direction facing upward is attached. Component recognition camera 31 images component D (or suction nozzle 25 which could not hold component D) held by suction nozzle 25 when suction nozzle 25 which picks up component D passes through upward. The imaging result is subjected to image recognition, and it is determined whether the posture of component D held by suction nozzle 25 is normal or abnormal, or whether a suction component recognition error (suction mistake) in which component D is not held occurs.

Also, the imaging result is subjected to image recognition, and the suction position deviation amount of component D sucked to suction nozzle 25 shifted from the expected normal suction position is calculated. When component D is mounted at component install position Ba on circuit board B, install position correction and install posture correction are performed based on the suction position deviation amount.

Mounting head 24, suction nozzle 25, and tape feeder 26 are appropriately selected according to the types of components D mounted on circuit board B, and are attached to component mounter M1. In this way, mounting head 24 for mounting component D on circuit board B, suction nozzle 25 which is installed on mounting head 24 to suck component D, or tape feeder 26 (the component supplier) for supplying component D to mounting head 24 becomes the equipment element attached to component mounter M1. Component mounter M1 for mounting component D on circuit board B is provided with at least one equipment element and becomes manufacturing equipment for manufacturing the product (mounting board).

A configuration of a control system of equipment element management system 1 will be described with reference to FIGS. 3 and 4. Component mounters M1 to M3 have a similar configuration, and component mounter M1 will be described below.

Figure 3:
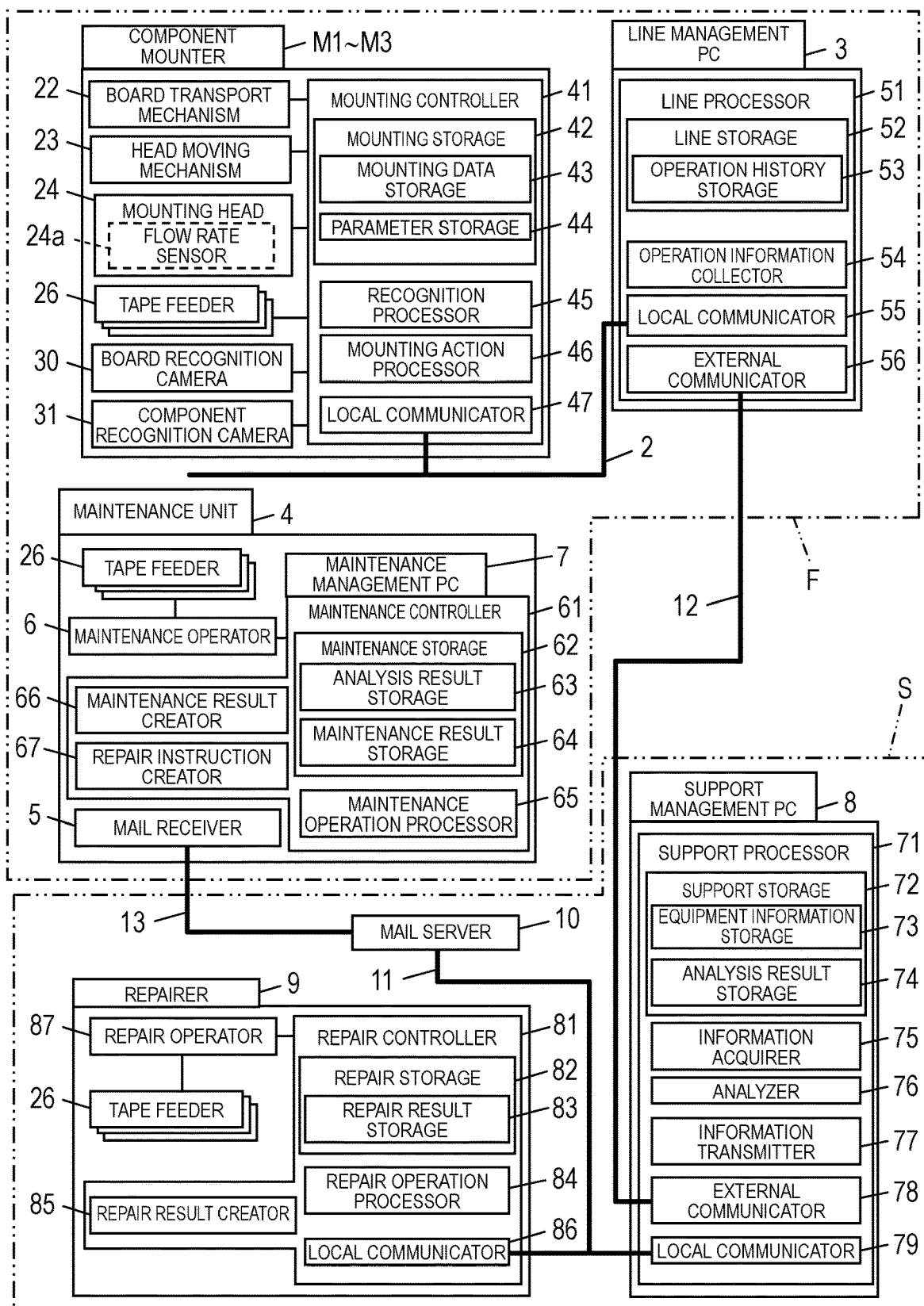
FIG. 3 is a block diagram illustrating a configuration of a control system of the equipment element management system according to the exemplary embodiment of the present disclosure.

In FIG. 3, component mounter M1 is provided with mounting controller 41. Mounting controller 41 is provided with mounting storage 42, recognition processor 45, mounting action processor 46, and local communicator 47. Local communicator 47 exchanges data with other component mounters M2 and M3, and line management PC 3 via local communication network 2. Mounting storage 42 is a storage device and is provided with mounting data storage 43 and parameter storage 44. Mounting data storage 43 is stored for each type of mounting board manufactured by data such as component type or size, and component install position Ba (XY coordinates) of component D mounted on circuit board B.

Recognition processor 45 performs image recognition on the imaging result of component supply port 26b of tape feeder 26 imaged by board recognition camera 30, calculates a correction value of the reference position when carrier tape 28 is pitch fed by tape feeder 26 and a correction value of the suction position of suction nozzle 25, and stores the result in parameter storage 44. Recognition processor 45 performs image recognition on the imaging result of suction nozzle 25 which picked up component D imaged by component recognition camera 31, calculates correction values of an install position and a mounting posture when component D is mounted on circuit board B, and stores the result in parameter storage 44. Recognition processor 45 performs image recognition on the imaging result and detects the supply component recognition error and the suction component recognition error.

In FIG. 3, mounting action processor 46 controls board transport mechanism 22, head moving mechanism 23, mounting head 24, and tape feeder 26 based on various types of data stored in mounting data storage 43 and various correction values (operation parameters) stored in parameter storage 44 to perform the component mounting action. When an operation error during the component mounting action is detected, mounting action processor 46 transmits the occurrence time of the operation error, the operation parameters when the operation error occurs, and the like to line management PC 3.

As the operation error, a suction error in which suction nozzle 25 cannot suck component D, the suction component recognition error in which component D which is sucked and held by suction nozzle 25 cannot be recognized by component recognition camera 31, a vacuum error in which the vacuum pressure of suction nozzle 25 detected by flow rate sensor 24a is higher than a predetermined value, and the supply component recognition error in which component D which is supplied by tape feeder 26 (component supplier) cannot be recognized by board recognition camera 30. In addition, in a case where component mounting line L1 is provided with a mounting inspection apparatus for inspecting component D mounted on the mounting board in addition to component mounters M1 to M3, a mounting error based on the presence or absence of component D inspected by the mounting inspection apparatus or the positional deviation amount of component D may be included as the operation error.

The configuration of the control system of tape feeder 26 will be described with reference to FIG. 4. Tape feeder 26 is provided with feeder controller 91. Feeder controller 91 is provided with feeder storage 92, tape feed processor 96, and communicator 97. When tape feeder 26 is attached to component mounters M1 to M3, data is exchanged with mounting controller 41 via communicator 97. As shown in FIG. 3, when tape feeder 26 is attached to maintenance operator 6, data is exchanged with maintenance controller 61 via communicator 97. When tape feeder 26 is attached to repair operator 87, data is exchanged with repair controller 81 via communicator 97.

Figure 4:
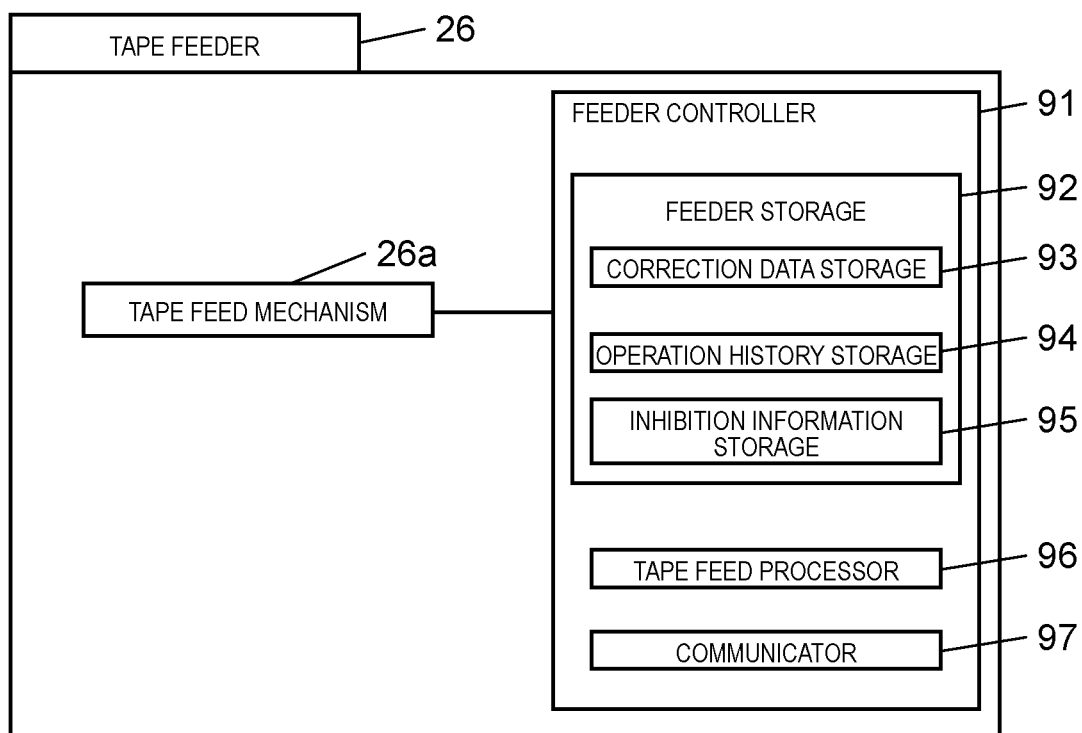
FIG. 4 is a block diagram illustrating a configuration of a control system of a tape feeder attached to the component mounter according to the exemplary embodiment of the present disclosure.

In FIG. 4, feeder storage 92 is a storage device, and is provided with correction data storage 93, operation history storage 94, and inhibition information storage 95. In correction data storage 93, among the operation parameters stored in parameter storage 44, the correction value of the reference position when carrier tape 28 is pitch fed by tape feeder 26 is transmitted and stored. Tape feed processor 96 controls tape feed mechanism 26a based on the correction value of the reference position stored in correction data storage 93 to perform the component supply action for sequentially supplying component D to component supply port 26b.

Operation history storage 94 stores operation history information such as the number of supply components supplied by tape feeder 26 (the component supplier) and a component supplier operation time that tape feeder 26 operated. Inhibition information storage 95 stores information (use inhibition information) on whether use of tape feeder 26 is inhibited. When tape feeder 26 that is stored in inhibition information storage 95 as inhibited from use is attached to component mounter M1, mounting controller 41 performs a use inhibition process such as informing the inhibition of use. In this way, tape feeder 26 (equipment element) is provided with inhibition information storage 95 for storing use inhibition information inhibiting the use of the equipment element. The use inhibition information may be a flag indicating whether or not the element is inhibited from using or history information including the date when the use inhibition information is updated.

In FIG. 3, line management PC 3 is provided with line processor 51. Line processor 51 is provided with line storage 52, operation information collector 54, local communicator 55, and external communicator 56. Local communicator 55 exchanges data with component mounters M1 to M3 via local communication network 2. External communicator 56 exchanges data with support management PC 8 installed in support center S via external communication network 12. Line storage 52 is a storage device and is provided with operation history storage 53.

Operation information collector 54 stores the occurrence time of the operation error transmitted from component mounters M1 to M3 and the operation parameters when the operation error occurs in operation history storage 53 in association with the information specifying the equipment element related to the operation error as an operation history information. In addition, operation information collector 54 collects the operation parameters, the mounting head operating time that mounting head 24 operated, the number of times of mounting components D for each suction nozzle 25, the number of supply components supplied by tape feeder 26 (the component supplier), and the component supplier operation time that tape feeder 26 operated at a predetermined timing such as every 1 hours in addition to the occurrence time of the operation error, and stores the collected information in operation history storage 53 as operation history information in association with the information specifying the equipment element.

In FIG. 3, support management PC 8 is provided with support processor 71. Support processor 71 is provided with support storage 72, information acquirer 75, analyzer 76, information transmitter 77, external communicator 78, and local communicator 79. Support storage 72 is a storage device, and is provided with equipment information storage 73 and analysis result storage 74. External communicator 78 exchanges data with line management PC 3 installed at factory F via external communication network 12. Local communicator 79 exchanges data with the repairer 9 and mail server 10 via local communication network 11.

Information acquirer 75 acquires operation history information from line management PC 3 at the predetermined timing such as every 1 hours, and stores the information as equipment information in equipment information storage 73 for each equipment element. Information acquirer 75 may acquire the updated difference on operation history information from the last acquisition or operation history information for a predetermined period of time, such as 1 day. In other words, in equipment information storage 73, information for a period of time that is long enough to analyze the tendency of the state of each equipment element needs to be stored. In this way, information acquirer 75 is a history information acquirer for acquiring the operation history information of the manufacturing equipment at the predetermined timing.

In FIG. 3, analyzer 76 analyzes the tendency of the state of the equipment elements based on the operation history information stored in equipment information storage 73. More specifically, analyzer 76 analyzes the contents of the operation error (such as a suction component recognition error, a vacuum error, and a supply component recognition error) to identify the equipment element that caused the operation error. Next, analyzer 76 calculates an error rate that is the number of operation errors per unit time (the number of times of unit operation) for each equipment element based on the information (such as the mounting head operation time, the number of times of mounting, the number of supply components, the component supplier operation time) relating to the operation time (the number of times of operation) of the equipment element.

Analyzer 76 determines an equipment element having a rate at which the error rate increases (increase rate) greater than a predetermined value, or an equipment element having a rate at which the correction value increases (increase rate) greater than a predetermined value as the equipment element with a state in a deterioration tendency and requiring the maintenance operation. The analysis result is stored in analysis result storage 74. The analysis results include contents of required maintenance operation, information that is used for the maintenance operation, and the like in addition to information that identifies the equipment element that requires the maintenance operation.

The necessity of the maintenance operation may be determined based on the error rate, the operation time, the number of times of operation, and the like of each equipment element in addition to the deterioration tendency of the state of the equipment element. In the case where the maintenance operation is determined to be necessary, in a case where the number of times of the maintenance operation (maintenance frequency) within a predetermined period is higher than the predetermined value, the equipment element may be determined to be transported to support center S to be subjected to the repair operation without being subjected to the maintenance operation.

Information transmitter 77 transmits the analysis result to maintenance unit 4. More specifically, the analysis result is transmitted to mail server 10 via local communication network 11, and is transmitted from mail server 10 to mail receiver 5 of maintenance unit 4 installed in factory F via external communication network 13. Thus, the risk of unauthorized access to maintenance management PC 7 in factory F can be reduced by passing the result through mail server 10 and mail receiver 5.

In FIG. 3, maintenance unit 4 is provided with mail receiver 5, maintenance operator 6, and maintenance management PC 7. Maintenance management PC 7 is provided with maintenance controller 61. Maintenance controller 61 is provided with maintenance storage 62, maintenance operation processor 65, maintenance result creator 66, and repair instruction creator 67. Maintenance storage 62 is a storage device and is provided with analysis result storage 63 and maintenance result storage 64. Analysis result storage 63 stores the analysis result received by mail receiver 5. Maintenance operation processor 65 controls maintenance operator 6 based on the analysis result stored in analysis result storage 63 to perform the maintenance operation for the equipment element.

Here, the maintenance operation by maintenance operator 6 will be described by taking tape feeder 26 (component supplier) as an example of the equipment element. Tape feeder 26 which is a subject of the maintenance operation is attached to maintenance operator 6. Maintenance operator 6 is provided with a camera (not shown) for imaging component supply port 26b, torque measuring means (not shown) for measuring torque of a motor provided in tape feeding mechanism 26a, cleaning means (not shown) for cleaning by injecting air, and the like. In other words, maintenance operator 6 has a function of measuring the state of tape feeder 26.

As the maintenance operation, operations that are not accompanied by replacement of the configuration component of the equipment element and repair of the equipment element of tape feeder 26 (configuration elements), such as cleaning of a mover, the distortion repair or adjustment of the sprockets or gears provided in tape feeding mechanism 26a, and the torque measurement of the motors provided in tape feed mechanism 26a, are performed. In this way, maintenance unit 4 receives the analysis result and performs the maintenance operation for the equipment element in which the state of the equipment element (tape feeder 6) is analyzed to be worse than the predetermined state. After the maintenance operation, the state (tape feed accuracy and the like) of tape feeder 26 is measured by maintenance operator 6.

In FIG. 3, in a case where it is determined that the state of tape feeder 26 after the maintenance operation is not improved enough to the predetermined state to be used in the component mounting operation, maintenance operation processor 65 stores the use inhibition information in inhibition information storage 95 of tape feeder 26. In other words, inhibition information storage 95 stores the use inhibition information in the case where the state of the equipment element (tape feeder 26) after the maintenance operation is not more improved than the predetermined state. Maintenance result creator 66 creates maintenance result information which is the result of the maintenance operation for the equipment element including a maintenance operation day, the good or fail result of content and improvement of the maintenance operation, the measurement result of the state after the maintenance operation, and the like, and stores the information in maintenance result storage 64 in association with the information specifying tape feeder 26 (equipment element).

An example of the maintenance result information will be described with reference to FIG. 5A. In this example, the maintenance result information of four tape feeders 26 with feeder numbers FA01, FA02, FB01, and FC01 is included. The maintenance result information includes the maintenance operation day, the operation content and the result, and the measurement result of the state after the maintenance operation including the torque rating ratio of the motor and the feed accuracy of tape feed mechanism 26a. In this example, it is determined that the state of tape feeder 26 is not improved in the case where the torque rating ratio is 0.9 or less or the feed accuracy is ±30 m or more. In other words, since FA02 has the torque rating ratio of 0.78 and 0.9 or less, and FB01 has a feed accuracy of ±55 m and ±30 m or more in the X direction, the result of the gear adjustment is determined to be "fail".

In this manner, repair instruction creator 67 creates a repair operation instruction for performing an instruction of the repair operation for the equipment element of which the state after the maintenance operation is not more improved than the predetermined state, even though the maintenance operation is performed based on the maintenance result information stored in maintenance result storage 64. The repair operation instruction is displayed on the display (not shown) provided in maintenance unit 4, and is printed from a print device (not shown) of maintenance unit 4 as a repair slip containing information of the transport destination such as support center S.

An example of the repair operation instruction will be described with reference to FIG. 5B. This example is repair operation information created from the maintenance result information shown in FIG. 5A. In other words, the repair operation information of two tape feeders 26 with feeder numbers FA02 and FB01 of which the state were determined to be not improved is included. Moreover, in addition to a repair operation item (gear adjustment), information used for the repair operation of operation such as the torque rating ratio of the motor and the feed accuracy of tape feed mechanism 26a after the maintenance operation is included as the instruction of the repair operation.

In FIG. 3, repairer 9 is provided with repair controller 81 and repair operator 87. Repair controller 81 is provided with repair storage 82, repair operation processor 84, repair result creator 85, and local communicator 86. Repair storage 82 is a storage device and is provided with repair result storage 83. Local communicator 86 exchanges data with support management PC 8 via local communication network 11. Repair operation processor 84 controls repair operator 87 to perform the repair operation for the equipment element. Alternatively, repair operator 87 performs auxiliary operation assisting the repair operation by a repair worker.

Here, the repair operation by repair operator 87 will be described by taking tape feeder 26 (component supplier) as an example of the equipment element. Repair operator 87 is attached with tape feeder 26 which is a subject of the repair operation transported by truck T from factory F. Repair operator 87 is provided with a camera (not shown) for imaging component supply port 26b, and a torque measuring means (not shown) for measuring the torque of the motor provided in tape feed mechanism 26a. In other words, repair operator 87 has a function of measuring the state of tape feeder 26.

As the repair operation, the operation that is accompanied by replacement of the configuration component of the equipment element and repair of the equipment element of tape feeder 26 (equipment elements), such as the motors, the sprockets, the gears, and the like provided in tape feed mechanism 26a are performed.

After the repair operation, the state of tape feeder 26 is measured by repair operator 87. When the state of tape feeder 26 is improved to the predetermined state after the repair operation, repair operation processor 84 deletes the use inhibition information from inhibition information storage 95 of tape feeder 26. As described above, inhibition information storage 95 deletes the use inhibition information when the repair operation is executed.

In FIG. 3, repair result creator 85 creates repair result information which is the result of the repair operation for the equipment element including the maintenance operation day, the content of the repair operation, the measurement result of the state after the repair operation, and the like, and stores the information in repair result storage 83 in association with the information specifying tape feeder 26 (equipment element).

An example of repair result information will be described with reference to FIG. 5C. This example is the repair result information that the repair operation is performed based on the repair operation instruction shown in FIG. 5B. In other words, replacement of the motor of tape feed mechanism 26a is performed as the repair operation of tape feeder 26 with feeder number FA02. Replacement of the gear of tape feed mechanism 26a is performed as the repair operation of tape feeder 26 with feeder number FB01. As a result of the repair operation, in addition to tape feeders 26 with feeder number FA02 and FB01, torque rating ratio of the motor and the feed accuracy of tape feed mechanism 26a are improved to the predetermined state.

Next, with reference to FIG. 6, an equipment element maintenance management method for managing the maintenance operation for the equipment element by equipment element management system 1 will be described. First, information acquirer 75 of support management PC 8 installed in support center S acquires the operation history information of component mounters M1 to M3 (manufacturing equipment) constituting component mounting line L1 installed at factory F from line management PC 3 installed at factory F at the predetermined timing (ST1: operation history information acquisition step). The acquired operation history information is stored in equipment information storage 73. Analyzer 76 of support management PC 8 analyzes the tendency of the state of the equipment element based on the acquired operation history information (ST2: analysis step).

Analyzer 76 determines whether the state of the equipment element is worse than the predetermined state (ST3: tendency determination step). In a case where the state of the equipment element is determined not to be worse than the predetermined state (No in ST3), the equipment element is continuously used for manufacturing. When the state of the equipment element is determined to be worse than the predetermined state (Yes in ST3), information transmitter 77 transmits the analysis result to maintenance unit 4 installed in factory F. In factory F, the equipment element determined to be deteriorating is transferred to maintenance unit 4 installed in factory F. It is also possible to perform the determination on when to perform the maintenance operation for the equipment element determined to be deteriorating in maintenance unit 4 and remove the mounting board to be manufactured from component mounters M1 to M3 at the timing of changing to be transferred to maintenance unit 4.

Figure 6:
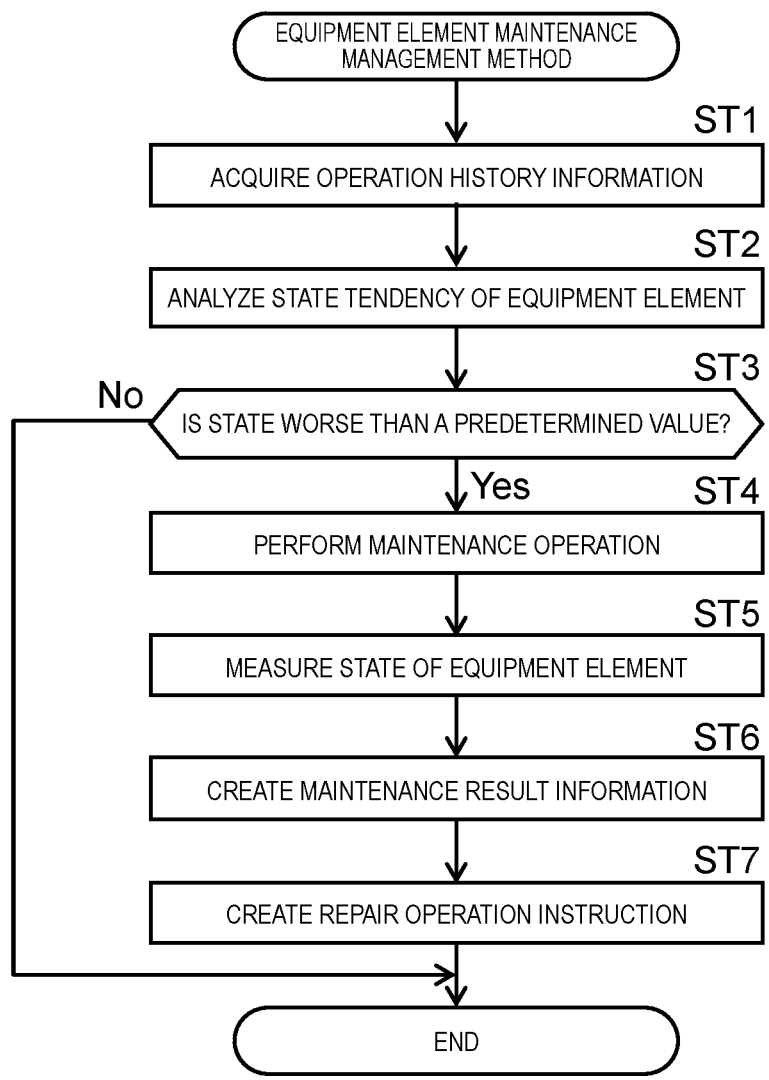
FIG. 6 is a flowchart illustrating an equipment element maintenance management method by the equipment element management system according to the exemplary embodiment of the present disclosure.

In FIG. 6, in maintenance unit 4, the maintenance operation for the equipment element of which the state is worse than the predetermined state is performed based on the received analysis result (ST4: maintenance operation step). Next, maintenance unit 4 measures the state of the equipment element after the maintenance operation (ST5: state measurement step). Then, maintenance result creator 66 creates the maintenance result information (see FIG. 5A), which is a result of the maintenance operation including a determination result whether the state of the equipment element after the maintenance operation is improved from the predetermined state based on the records of the maintenance operation and the measurement result of the state of the equipment element after the maintenance operation (ST6: maintenance result information creating step).

Next, repair instruction creator 67 creates a repair operation instruction (see FIG. 5B) for performing the instruction of the repair operation for the equipment element of which the state after the maintenance operation is not more improved than the predetermined state, based on the maintenance result information (ST7: repair instruction creating step). The equipment element of which the state is improved to the predetermined state by the maintenance operation is sent back to component mounting line L1 from maintenance unit 4 to be used in the manufacturing. In this way, in the equipment element management method by equipment element management system 1, the analysis of the state of the equipment elements is performed collectively by analyzer 76 of support center S (ST2), and the maintenance operation is performed only for the equipment elements requiring the maintenance operation (Yes in ST3) by maintenance unit 4 in factory F which is closer to component mounters M1 to M3 (manufacturing equipment) than the analyzer 76 (ST4).

As described above, equipment element maintenance management system 1 of the present exemplary embodiment for managing maintenance operation for the equipment element includes information acquirer 75 for acquiring the operation history information of the manufacturing equipment at a predetermined timing, analyzer 76 for analyzing the tendency of the state of the equipment element based on the acquired operation history information, maintenance result creator 66 for creating the maintenance result information of the equipment element that the state there of is analyzed to be worse than the predetermined state, and repair instruction creator 67 for creating the repair operation instruction to perform the instruction of the repair operation for the equipment element of which the state after the maintenance operation is not more improved than the predetermined state based on the maintenance result information. Thus, the maintenance operation for the equipment element can be managed efficiently.

Next, with reference to FIG. 7, another example (hereinafter, referred to as "second equipment element management system 101") of the equipment element management system will be described.

Second equipment element management system 101 has the same configuration with above-described equipment element management system 1 (hereinafter, referred to as "first equipment element management system 1" as necessary), component mounters M1 to M3, and line management PC 3, and partially different configurations with maintenance unit 104, support management PC 108, and repairer 109.

The same reference numerals are added to the same parts as first equipment element management system 1, and the description thereof is omitted.

Support processor 171 of support management PC 108 is provided with repair instruction creator 110 in addition to support storage 172, information acquirer 175, analyzer 176, information transmitter 177, external communicator 178, and local communicator 79. Support storage 172 is provided with equipment information storage 173 and analysis result storage 74. External communicator 178 exchanges data with maintenance unit 104 via external communication network 12 in addition to exchanging data with line management PC 3 via external communication network 12.

Figure 7:
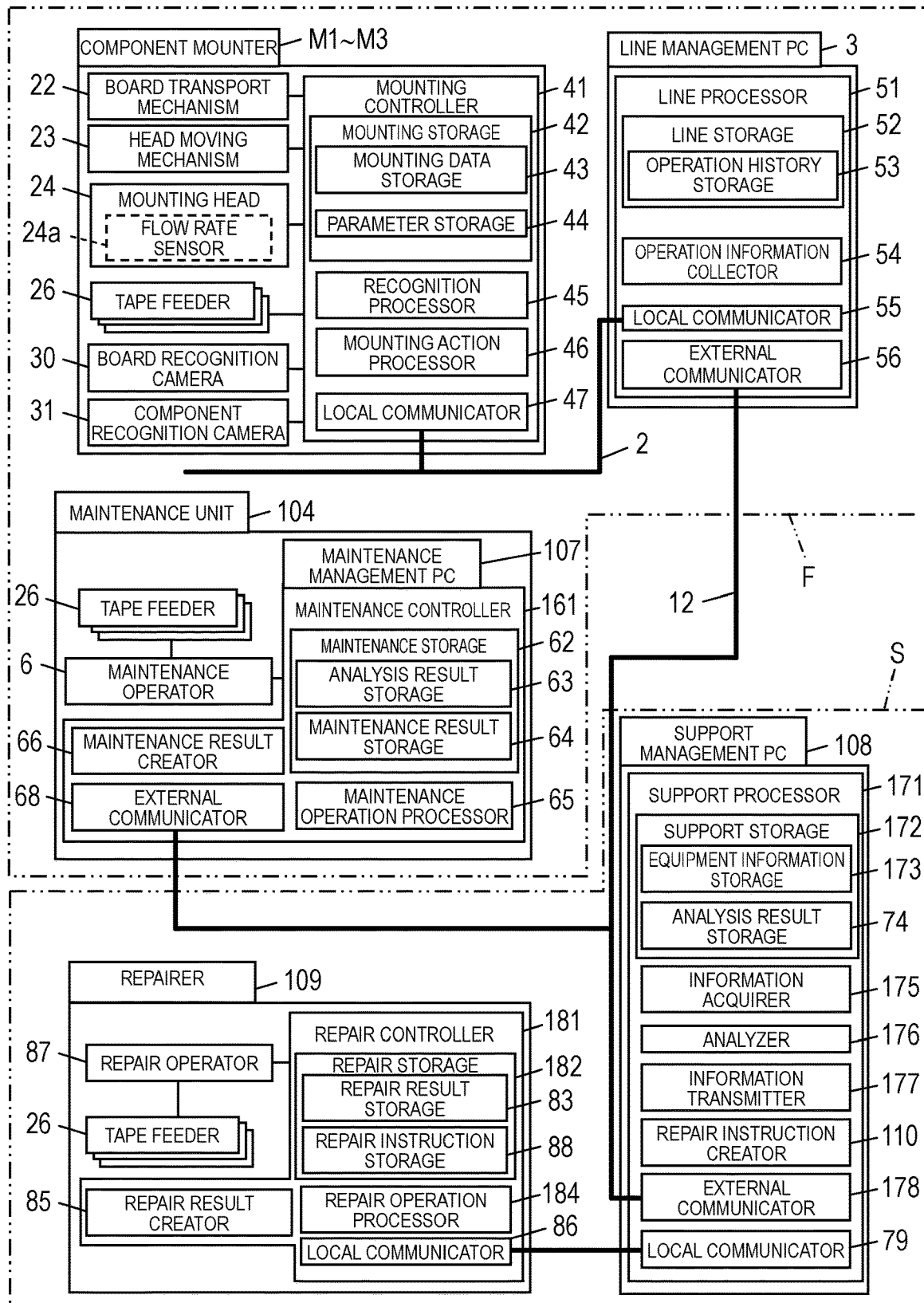
FIG. 7 is a block diagram illustrating a configuration of a control system of another equipment element management system according to the exemplary embodiment of the present disclosure.

In FIG. 7, in addition to acquiring operation history information from line management PC 3 at the predetermined timing, information acquirer 175 acquires maintenance result information from maintenance unit 104 and the repair result information from repairer 109, and stores the acquired information in equipment information storage 173. Analyzer 176 analyzes the tendency of the state of the equipment element based on the maintenance result information and the repair result information in addition to the operation history information. As a result, the tendency of the state of the equipment element can be predicted more accurately; for example, the state of the equipment elements having shorter maintenance operation intervals than average equipment elements deteriorates more quickly, and the state of the equipment elements having shorter operation time from the replacement of the configuration components than the average equipment elements deteriorates more slowly.

The analysis result is stored in analysis result storage 74 and is transmitted to maintenance unit 104 by information transmitter 177.

Repair instruction creator 110 creates the repair operation instruction for performing the instruction of the repair operation for the equipment element of which the state after the maintenance operation is not more improved than the predetermined state even though the maintenance operation is performed, based on the maintenance result information stored in equipment information storage 173. The repair operation instruction is sent to repairer 109 and the person in charge of factory F by information transmitter 177. In other words, information transmitter 177 becomes an information transmitter for transmitting the repair operation instruction for performing the instruction of the repair operation for the equipment element in a case where the state of the equipment element after the maintenance operation is not more improved than the predetermined state.

The person in charge of factory F who received the repair operation instruction loads the equipment element that received the repair operation instruction on truck T and transports the equipment element to repairer 109 of support center S. Since the person in charge of support center S receives the repair operation instruction before the equipment element is transported, the repair operation for the equipment element can be performed efficiently by preparing and allocating the configuration component to be replaced beforehand.

In FIG. 7, maintenance unit 104 is provided with external communicator 68 in maintenance controller 161 provided in maintenance management PC 107 instead of mail receiver 5. External communicator 68 exchanges data with support management PC 108 via external communication network 12. In repairer 109, repair controller 181 is provided with repair storage 182, repair operation processor 184, repair result creator 85, and local communicator 86.

Repair storage 182 is provided with repair instruction storage 88 in addition to repair result storage 83. Repair instruction storage 88 stores the repair operation instruction transmitted from support management PC 108. Maintenance unit 104 further includes a local communicator for exchanging data with line management PC 3 or component mounters M1 to M3, and may transmit the use inhibition information for inhibiting the use of the equipment element to line management PC 3 via the local communicator. In this way, in a case where the inhibited equipment elements is attached to component mounters M1 to M3, line management PC 3 can notify or warn that the use of line management PC 3 is inhibited.

Repair operation processor 184 controls repair operator 87 based on the repair operation instruction stored in repair instruction storage 88 to perform the repair operation for the equipment element. Alternatively, repair operation processor 184 causes repair operator 87 to perform an auxiliary operation assisting the repair operation by the repair worker. Repair operation processor 184 displays the contents shown in the repair operation instruction on the display (not shown). As a result, the repair worker can easily understand the repair operation and execute the repair operation efficiently. In this manner, repairer 109 receives the repair operation instruction and performs the repair operation, of which the instruction is performed, of the equipment element.

Next, with reference to FIG. 8, an equipment element repair management method for managing the repair operation for the equipment element by second equipment element management system 101 will be described. First, maintenance unit 104 performs the maintenance operation for the equipment element (ST11: maintenance operation step). This maintenance operation step (ST11) is the same as the maintenance operation step (ST4) of the equipment element maintenance management method. The operation history information acquisition step (ST1), the analysis step (ST2), and a maintenance determination step (ST3) of the equipment element maintenance management method may be executed before the maintenance operation step (ST11). Next, in maintenance unit 104, the state of the equipment element after the maintenance operation is measured (ST12: state measurement step). Next, in maintenance unit 104, whether the state of the equipment element after the maintenance operation is more improved than the predetermined state is determined (ST13: state determination step).

If the state of the equipment element is determined to be improved to the predetermined state by the maintenance operation (Yes in ST13), the corresponding equipment element is returned to component mounting line L1. When it is determined that the state of the equipment element after the maintenance operation is not improved from the predetermined state (No in ST13), the use inhibition information for inhibiting the use of the equipment element is stored in inhibition information storage 95 of tape feeder 6 (equipment element) to be subjected to the repair operation (ST14: use inhibition information storage step). Then, maintenance result creator 66 creates the maintenance result information and sends the result to support management PC 108. Next, the repair instruction creator 110 creates the repair operation instruction (ST15: repair operation instruction creating step). The created repair operation instruction is sent to the person in charge of factory F and repairer 109.

In repairer 109 in which the repair operation for the equipment element is performed, the equipment element of which the state is not more improved than the predetermined state is transported (ST16: carrying-in step). Next, the repair operation of the transported equipment element which is a subject of the repair operation is executed in repairer 109 (ST17: repair operation step). Then, the use inhibition information is deleted from the storage of the equipment element for which the repair operation is finished (ST18: use inhibition information deletion step). Next, the equipment element that the repair operation is finished is transported to factory F (ST19: carrying-out step).

In the method of repairing the equipment element by second equipment element management system 101, the maintenance operation is performed by maintenance unit 4 in factory F closer to component mounters M1 to M3 (manufacturing equipment) than repairer 109 (ST11), and transports only the equipment element which needs to be repaired (No in ST13) to repairer 109 to perform the repair operation (ST17). The use inhibition information may be stored in association with the information specifying the equipment element in the storage of support management PC 108 or line management PC 3 instead of the storage of the respective equipment elements, and usability thereof may be managed. In this case, when there is a query made from component mounters M1 to M3 installed with the equipment elements, the presence or absence of the use inhibition information is returned from support management PC 108 or line management PC 3.

As described above, second equipment element management system 101 of the present exemplary embodiment for managing the repair operation of the equipment element includes maintenance unit 104 for performing maintenance operation for the equipment element, an instruction transmitter (information transmitter 177) for transmitting the repair operation instruction for performing the repair operation, of which the instruction is performed, of the equipment element in a case where the state of the equipment element after the maintenance operation is not more improved than the predetermined state, and repairer 109 for receiving the repair operation instruction to perform the repair operation, of which the instruction is performed of the equipment element. Thus, the repair operation for the equipment element can be managed efficiently.

In a case where the equipment element is mounting head 24, the cleaning of the mover, the adjustment and replacement of the cylinder (not shown) for raising and lowering suction nozzle 25 and the like are performed as the maintenance operation and the repair operation. In a case where the equipment element is suction nozzle 25, cleaning of the nozzle, shaft adjustment, and the like are performed for the maintenance operation and the repair operation.

The equipment element maintenance management system and the equipment element maintenance management method of the present disclosure have the effect of managing the maintenance operation for the equipment element efficiently, and is useful in the field where the components are mounted on the board.

What is claimed is:

1. An equipment element maintenance management method for managing a maintenance operation for an equipment element that is attached to a manufacturing equipment for manufacturing a product, the method comprising:
   acquiring operation history information of the manufacturing equipment at a predetermined timing;
   analyzing of a first performance state of the equipment element based on the acquired operation hi story information;
   transferring the equipment element to a local maintenance unit for performing the maintenance operation for the equipment element of which the first performance state is worse than a predetermined state;
   creating maintenance result information which is a result of the maintenance operation at the local maintenance unit by analyzing a second performance state of the equipment element; and
   determining whether the second performance state of the equipment element is improved than the predetermined state;
   in response to the second performance state not being improved than the predetermined threshold state, creating a repair operation instruction for transferring the equipment element to a distant repair center for performing a repair operation for the equipment element.

2. The equipment element maintenance management method of claim 1,
   wherein the operation history information includes at least one of an occurrence time of an operation error at the manufacturing equipment and an operation parameter of the manufacturing equipment when the operation error occurs.

3. The equipment element maintenance management method of claim 1,
   wherein the maintenance operation is an operation that is not accompanied by replacement of a configuration component of the equipment element and repair of the equipment element.

4. The equipment element maintenance management method of claim 1,
   wherein the first state of the equipment element is analyzed based on the operation history information and the maintenance result information.

5. The equipment element maintenance management method of claim 1,
   wherein the manufacturing equipment is a component mounter that mounts a component on a circuit board, and
   wherein the equipment element is at least one of a mounting head that mounts the component on the circuit board, a suction nozzle that is installed on the mounting head to suck the component, and a component supplier that supplies the component to the mounting head.

6. The equipment element maintenance management method of claim 5,
   wherein the operation history information includes at least one of a mounting head operation time for which the mounting head is operated, the number of times of mounting components for each of the suction nozzles, the number of supplied components supplied by the component supplier, and a component supplier operation time for which the component supplier is operated.

7. The equipment element maintenance management method of claim 5,
   wherein an operation error in the manufacturing equipment includes at least one of a suction error in which the suction nozzle cannot suck a component, a suction component recognition error in which the component sucked and held by the suction nozzle cannot be recognized, a vacuum error in which a vacuum pressure of the suction nozzle is higher than a predetermined value, and a supply component recognition error in which the component to be supplied by the component supplier cannot be recognized.

8. The equipment element maintenance management method of claim 1, further comprising:
   storing information of inhibiting use of the equipment element when the second state of the equipment element after the maintenance operation is not better than the predetermined state based on the maintenance result information.

9. The equipment element maintenance management method of claim 8, wherein the equipment element is one of a plurality of tape feeders and the information of inhibiting use indicates which tape feeder to be inhibited.

10. The equipment element maintenance management method of claim 8, further comprising deleting the information of inhibiting use of the equipment element when the repair operation is complete for the equipment element.

* * * * *